(12) United States Patent
Ban et al.

(10) Patent No.: US 10,741,692 B2
(45) Date of Patent: Aug. 11, 2020

(54) LTPS THIN FILM TRANSISTOR AND METHOD FOR MANUFACTURING THE SAME, ARRAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventors: Shengguang Ban, Beijing (CN); Zhanfeng Cao, Beijing (CN); Qi Yao, Beijing (CN); Dapeng Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/036,099

(22) Filed: Jul. 16, 2018

(65) Prior Publication Data
US 2019/0148561 A1 May 16, 2019

(30) Foreign Application Priority Data
Nov. 14, 2017 (CN) .......................... 2017 1 1121996

(51) Int. Cl.
*H01L 29/78* (2006.01)
*H01L 29/786* (2006.01)
(Continued)

(52) U.S. Cl.
CPC .... *H01L 29/78633* (2013.01); *H01L 21/0273* (2013.01); *H01L 21/32055* (2013.01);
(Continued)

(58) Field of Classification Search
CPC ......... H01L 29/78633; H01L 21/32055; H01L 21/0273; H01L 29/78675; H01L 29/66757;
(Continued)

(56) References Cited

U.S. PATENT DOCUMENTS

| 2006/0003501 A1* | 1/2006 | Kakkad | H01L 29/66757 438/149 |
| 2008/0213961 A1* | 9/2008 | Leonardi | H01L 29/78621 438/285 |

(Continued)

FOREIGN PATENT DOCUMENTS

| CN | 1716552 A | 1/2006 |
| CN | 103354218 A | 10/2013 |

(Continued)

OTHER PUBLICATIONS

First Office Action for Chinese Application No. 201711121996.1, dated Nov. 4, 2019, 8 pages.

*Primary Examiner* — Charles D Garber
*Assistant Examiner* — S M Sohel Imtiaz
(74) *Attorney, Agent, or Firm* — Brooks Kushman P.C.

(57) ABSTRACT

The present disclosure provides a method for manufacturing an LTPS thin film transistor which includes: forming a light shielding pattern and an active layer of the LTPS thin film transistor on a base substrate through one single patterning process, in which an orthogonal projection of the active layer on the base substrate falls within an orthogonal projection of the light shielding pattern on the base substrate, and the light shielding pattern is made of a semiconductor material.

6 Claims, 2 Drawing Sheets

(51) Int. Cl.
*H01L 27/12* (2006.01)
*H01L 29/66* (2006.01)
*H01L 21/027* (2006.01)
*H01L 21/3205* (2006.01)
*G02F 1/1362* (2006.01)
*G02F 1/1368* (2006.01)

(52) U.S. Cl.
CPC ........ *H01L 27/127* (2013.01); *H01L 27/1222* (2013.01); *H01L 27/1288* (2013.01); *H01L 29/66757* (2013.01); *H01L 29/78675* (2013.01); *G02F 1/1368* (2013.01); *G02F 1/136209* (2013.01)

(58) Field of Classification Search
CPC ............... H01L 27/1288; H01L 27/127; H01L 27/1222; G02F 1/1368; G02F 1/136209
See application file for complete search history.

(56) References Cited

U.S. PATENT DOCUMENTS

| | | | | |
|---|---|---|---|---|
| 2011/0309397 | A1* | 12/2011 | Cheng | G02F 1/136227 257/98 |
| 2015/0311350 | A1* | 10/2015 | Huang | H01L 29/78675 257/66 |
| 2015/0318311 | A1* | 11/2015 | Cheng | H01L 29/42384 257/43 |
| 2016/0027887 | A1* | 1/2016 | Yuan | H01L 29/78696 257/43 |
| 2016/0141425 | A1* | 5/2016 | Sun | H01L 29/41733 257/72 |
| 2016/0172387 | A1* | 6/2016 | Wang | H01L 27/1237 257/71 |
| 2016/0291431 | A1* | 10/2016 | Hu | H01L 21/02592 |
| 2016/0343747 | A1* | 11/2016 | Du | G02F 1/1368 |
| 2017/0192321 | A1* | 7/2017 | Li | H01L 29/66757 |
| 2019/0207039 | A1 | 7/2019 | Yao et al. | |
| 2019/0237488 | A1 | 8/2019 | Li et al. | |

FOREIGN PATENT DOCUMENTS

| | | | |
|---|---|---|---|
| CN | 103745978 A | 4/2014 | |
| CN | 103996655 A | 8/2014 | |
| CN | 104332477 A | 2/2015 | |
| CN | 104485333 A | 4/2015 | |
| CN | 104538400 A | 4/2015 | |
| CN | 105529301 A * | 4/2016 | ....... H01L 29/66757 |
| CN | 105529301 A | 4/2016 | |
| CN | 106773431 A | 5/2017 | |
| CN | 107104110 A | 8/2017 | |
| CN | 107248373 A | 10/2017 | |
| CN | 107316906 A | 11/2017 | |
| CN | 107342260 A | 11/2017 | |

* cited by examiner

LTPS THIN FILM TRANSISTOR AND METHOD FOR MANUFACTURING THE SAME, ARRAY SUBSTRATE AND METHOD FOR MANUFACTURING THE SAME, AND DISPLAY DEVICE

CROSS-REFERENCE TO RELATED APPLICATION

This application claims priority to Chinese Patent Application No. 201711121996.1 filed on Nov. 14, 2017, which is incorporated herein by reference in its entirety.

TECHNICAL FIELD

The present disclosure relates to the field of display technology, and in particular to an LTPS thin film transistor and a method for manufacturing the same, an array substrate and a method for manufacturing the same, and a display device.

BACKGROUND

With the development of display technology, low temperature polysilicon (LTPS) backplane technology has a high aperture ratio resulting from its high mobility and can realize a gate drive on array (GOA), etc, thus a display panel based on this technology has a more excellent display quality in comparison to a display panel based on amorphous silicon (a-Si) technology. As a result, the LTPS backplane technology has been receiving increasing attention, and also is an important branch of a small-size liquid crystal display (LCD) in the related art. However, the LTPS array substrate in the related art has drawbacks, such as a complicated process and a high cost. As compared with the amorphous silicon array substrate in the related art, which requires 4 to 5 Mask processes, the LTPS array substrate requires 9 or more Mask processes, which leads to a high production cost of the LTPS array substrate and limits the productivity of the LTPS array substrate.

SUMMARY

The embodiments of the present disclosure provide a method for manufacturing an LTPS thin film transistor, which includes:

forming a light shielding pattern and an active layer of the LTPS thin film transistor on a base substrate through one single patterning process, wherein an orthogonal projection of the active layer on the base substrate falls within an orthogonal projection of the light shielding pattern on the base substrate, and the light shielding pattern is made of a semiconductor material.

In one example, an electrical conductivity of the semiconductor material adopted by the light shielding pattern is greater than that of amorphous silicon.

In one example, the light shielding pattern is made of heavily doped amorphous silicon.

In one example, the forming the light shielding pattern and the active layer of the LTPS thin film transistor on the base substrate through the one single patterning process includes:

forming a first buffer layer on the base substrate;
forming a heavily doped amorphous silicon layer on the first buffer layer;
forming a second buffer layer on the heavily doped amorphous silicon layer;

forming a polysilicon layer on the second buffer layer;
coating a photoresist on the polysilicon layer and exposing the photoresist to form a photoresist-removed area and a photoresist-reserved area, and removing the heavily doped amorphous silicon layer, the second buffer layer and the polysilicon layer at the photoresist-removed area, to form the light shielding pattern by the heavily doped amorphous silicon layer at the photoresist-reserved area and form the active layer by the polysilicon layer at the photoresist-reserved area; and peeling off the photoresist at the photoresist-reserved area.

In one example, the forming the heavily doped amorphous silicon layer on the first buffer layer includes:

forming the heavily doped amorphous silicon layer on the first buffer layer by plasma enhanced chemical vapor deposition (PECVD).

The embodiments of the present disclosure further provide an LTPS thin film transistor, which includes a light shielding pattern and an active layer arranged on a base substrate, wherein an orthogonal projection of the active layer on the base substrate falls within an orthogonal projection of the light shielding pattern on the base substrate, and the light shielding pattern is made of a semiconductor material.

In one example, the LTPS thin film transistor includes a first buffer layer, the light shielding pattern made of the heavily doped amorphous silicon, a second buffer layer, and the active layer made of the polysilicon, successively arranged on the base substrate.

In one example, when the light shielding pattern is made of heavily doped amorphous silicon, a thickness of the light shielding pattern is about 500 Å to about 1500 Å.

The embodiments of the present disclosure further provide a method for manufacturing an LTPS array substrate, which includes manufacturing an LTPS thin film transistor on a base substrate by the method as described above.

The embodiments of the present disclosure further provide an LTPS array substrate, which includes the LTPS thin film transistor as described above arranged on a base substrate.

The embodiments of the present disclosure further provide a display device, which includes the LTPS array substrate as described above.

DETAILED DESCRIPTION

In order to make the technical problem to be solved, technical solutions and advantages in the embodiments of the present disclosure more clear, a detail description will be illustrated by the following exemplary embodiments with reference to the drawings.

In the related art, a light shielding pattern is generally made of metal Mo, so as to prevent the active layer of the LTPS thin film transistor from being illuminated and thus prevent the device properties of the LTPS thin film transistor from being affected. Since Mo is a conductor, it thus cannot be manufactured by one single patterning process together with the active layer. It is required to perform patterning of Mo to form the light shielding pattern, and then deposit the buffer layer and the low temperature polysilicon material, and then perform patterning of the low temperature polysilicon material to form the pattern of the active layer. Such an LTPS array substrate has to be manufacture by at least 9 Mask processes, which leads to a high production cost of the LTPS array substrate, and limit the productivity of the LTPS array substrate.

In view of the problems such as the high number of patterning processes and high production cost required for the LTPS array substrate in the related art, the embodiments of the present disclosure provide an LTPS thin film transistor and a method for manufacturing the same, an array substrate and a method for manufacturing the same, and a display device, capable of reducing the production cost of a low temperature polysilicon array substrate and effectively increasing the productivity of the low temperature polysilicon array substrate.

The embodiments of the present disclosure provide a method for manufacturing an LTPS thin film transistor, which includes:

forming a light shielding pattern and an active layer of the LTPS thin film transistor on a base substrate through one single patterning process, in which an orthogonal projection of the active layer on the base substrate falls within an orthogonal projection of the light shielding pattern on the base substrate, and the light shielding pattern is made of a semiconductor material.

In this embodiment, the light shielding pattern is made of a semiconductor material, so that the light shielding pattern and the active layer of the LTPS thin film transistor can be simultaneously formed by one single patterning process rather than forming the light shielding pattern and the active layer separately by two patterning processes. Thus, the numbers of patterning processes for manufacturing the LTPS thin film transistor and the LTPS array substrate are reduced, thereby being capable of lowering the production cost of the LTPS array substrate and effectively increasing the productivity of the LTPS array substrate.

Figure 1:
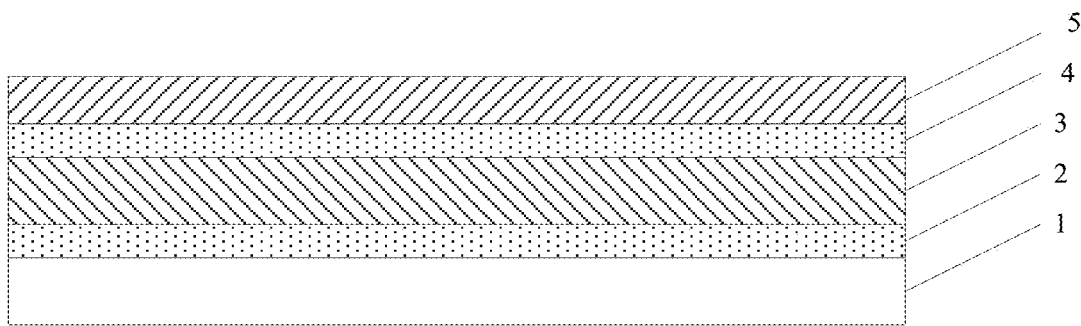
FIG. 1 is a schematic diagram of an LTPS thin film transistor in which a light shielding pattern is an amorphous silicon layer according to an embodiment of the present disclosure.

Amorphous silicon (i.e. a-Si) may be used as the semiconductor material. As shown in FIG. 1, the LTPS thin film transistor of the embodiment of the present disclosure successively includes a first buffer layer 2, an amorphous silicon layer 3, a second buffer layer 4 and a polysilicon layer 5 arranged on a base substrate 1. The first buffer layer 2 may be made of silicon nitride or silicon oxide, the second buffer layer 4 may be made of silicon oxide, the amorphous silicon layer 3 is used to form a light shielding pattern, and the polysilicon layer 5 is used to form an active layer of the LTPS thin film transistor.

Figure 2:
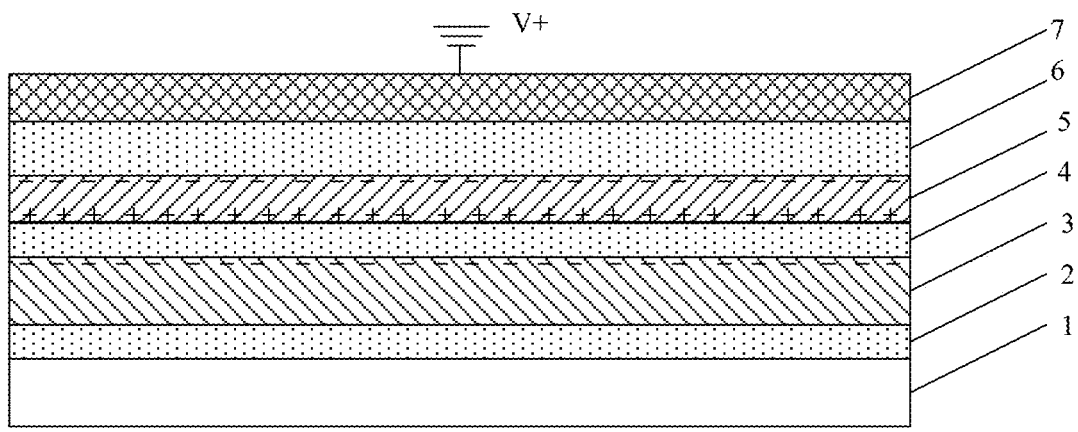
FIG. 2 is a schematic diagram of an LTPS thin film transistor after a voltage is applied to a gate electrode according to an embodiment of the present disclosure.

In addition, using the amorphous silicon layer 3 as the light shielding pattern may have an adverse effect on a channel in the LTPS thin film transistor. As shown in FIG. 2, the LTPS thin film transistor further includes a gate insulating layer 6 on the polysilicon layer 5 and a gate metal layer 7 on the gate insulating layer 6, in which the gate insulating layer 6 may be made of silicon nitride or silicon oxide, and the gate metal layer 7 is used to manufacture the gate electrode of the LTPS thin film transistor.

As shown in FIG. 2, when the LTPS thin film transistor is operated, a voltage is applied to the gate electrode. After the gate electrode is applied with a voltage, a negative charge is induced on the upper surface of the active layer, i.e., the polysilicon layer 5, so that the LTPS thin film transistor channel is turned on and works. At this time, there will be a positive charge accumulation on the lower surface of the polysilicon layer 5. Since the thickness of the second buffer layer 4 in the film layer structure of the related art is relatively small, the positive charge induced on the lower surface of the polysilicon layer 5 has an adverse effect on the amorphous silicon layer 3, and negative charges are induced on the upper surface of the amorphous silicon layer 3.

Figure 3:
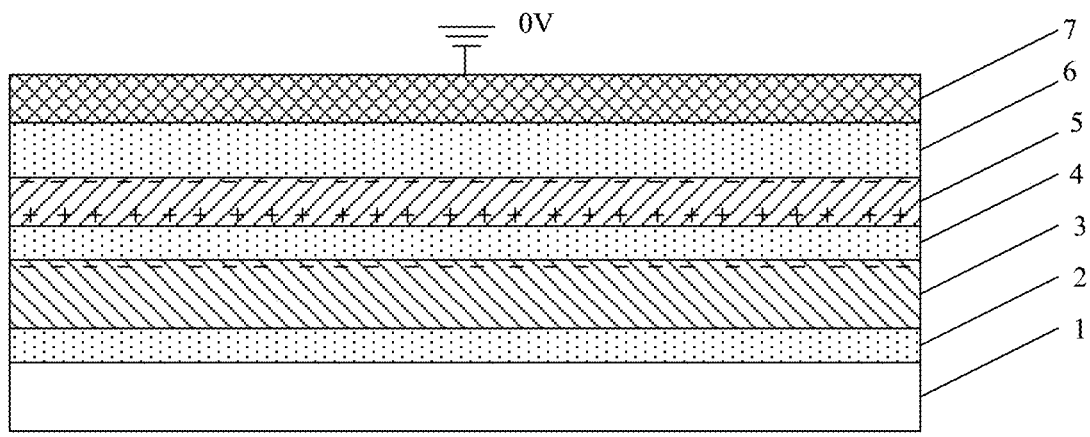
FIG. 3 is a schematic diagram of an LTPS thin film transistor after the voltage applied to the gate electrode is eliminated according to an embodiment of the present disclosure.

Since the light shielding pattern made of the amorphous silicon layer 3 is island-like, the negative charges on the upper surface of the amorphous silicon layer 3 cannot be eliminated. As shown in FIG. 3, after the voltage applied to the gate electrode is eliminated, the presence of the negative charges on the upper surface of the amorphous silicon layer 3 will affect the charge distribution in the active layer of the LTPS thin film transistor, thereby adversely affecting a normal operation of the LTPS thin film transistor channel, causing a shift of the threshold voltage (Vth) of the LTPS thin film transistor, and resulting in a negative bias of Vth.

In order to avoid the shift of the threshold voltage Vth of the LTPS thin film transistor, in this embodiment, a light shielding pattern may be made of a semiconductor material having a greater electrical conductivity than that of amorphous silicon. When the electrical conducting property of the semiconductor material is great, the semiconductor property of the original light shielding pattern may be weakened, thereby weakening the adverse effect on the light shielding pattern made of the semiconductor caused by the voltage applied to the gate electrode. Thus, the adverse effect of the light shielding pattern on the active layer may be weakened, such that the Vth shift phenomenon of the LTPS thin film transistor is also weakened to a certain extent.

Figure 4:
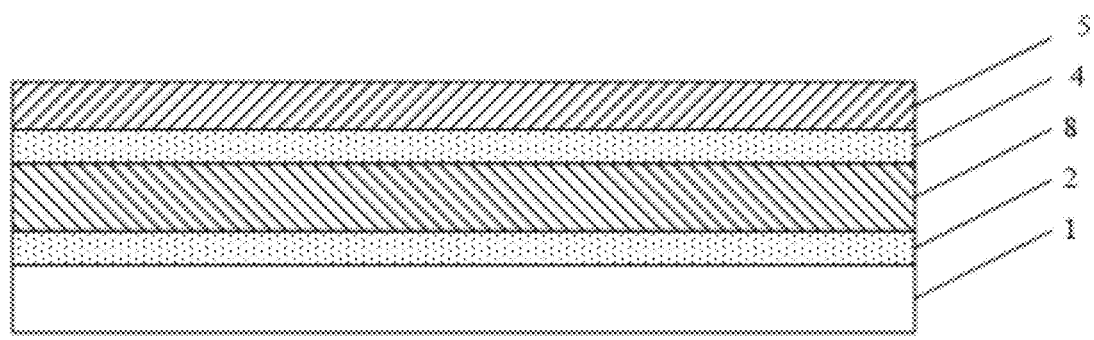
FIG. 4 is a schematic diagram of an LTPS thin film in which a light shielding pattern is a heavily doped amorphous silicon layer according to an embodiment of the present disclosure.

For example, the light shielding pattern may be made of heavily doped amorphous silicon. As shown in FIG. 4, the amorphous silicon layer 3 in FIG. 1 is replaced with a heavily doped amorphous silicon ($n^+$a-Si) layer 8, that is, more p-ions are added during the deposition of the amorphous silicon material, so that the concentration of carriers in the a-Si may be increased. The light shielding pattern is made more like a conductor, so as to weaken the semiconductor property of the original a-Si and to weaken the adverse effect on the light shielding pattern caused by the voltage applied on the gate electrode. Thus, the adverse effect of the light shielding pattern on the active layer may be weakened, thereby reducing or eliminating the problem of Vth shift of the LTPS thin film transistor.

For example, the method for manufacturing the LTPS thin film transistor according to example 1 of the present disclosure includes the following steps.

Step 1: a base substrate 1 is provided, and a first buffer layer 2 is formed on the base substrate 1.

The base substrate 1 may be a glass or quartz substrate. For example, the first buffer layer 2 may be deposited on the base substrate 1 by a plasma enhanced chemical vapor deposition (PECVD) method, and the first buffer layer 2 may be made of an oxide, a nitride, or an oxynitride.

Step 2: a heavily doped amorphous silicon layer 8 is formed on the first buffer layer 2.

In this embodiment, the heavily doped amorphous silicon layer 8 is deposited on the first buffer layer 2 by the PECVD method. The processing parameters of the PECVD may be shown as follows: the deposition temperature is 250° C., the deposition power is 300 W, the working distance of the substrate for deposition is 1000 mil, the deposition pressure is 1230 mTorr, and the reaction gas is $SiH_4$ (with a gas flow rate of 190 sccm), $H_2$ (with a gas flow rate of 1250 sccm), and $PH_3$ (with a gas flow rate of 250 sccm). The heavily doped amorphous silicon layer 8 with a good electrical conducting property can be obtained by this method, so as to weaken the semiconductor properties of the light shielding pattern, so that the Vth shift phenomenon of the LTPS thin film transistor is reduced to a certain extent, thereby ensuring the performance of the LTPS thin film transistor.

The interior of the film layer of the heavily doped amorphous silicon layer 8 obtained by the PECVD method contains uniform p-ions, and there is no difference in the concentration of p-ions between the surface and the interior of the heavily doped amorphous silicon layer 8. However, if the heavily doped amorphous silicon layer 8 is prepared by doping method, that is, doping p-ions in the amorphous silicon layer, the doped p-ions will mostly exist on the surface of the amorphous silicon layer due to the characteristics of the doping itself, and there are less p-ions in the interior of the amorphous silicon layer. Therefore, as compared with the doping method, the PECVD method can effectively eliminate the Vth shift phenomenon of the LTPS thin film transistor.

As shown in Table 1, there are great differences in the carrier concentration and the square resistance in the interior between the amorphous silicon layers containing p-ions obtained by the PECVD method and by the doping method.

TABLE 1

| Realization Means | PECVD | Doping |
|---|---|---|
| Electron concentration/$cm^3$ | $3 \times 10^{17}$ | $1 \times 10^{15}$ |
| Square resistance/$\Omega$/sq | Around 400 | Around 20000 |

As can be seen from the above table, as measured by the doping concentration, the electron concentration of $n^+a$-Si obtained by the PECVD method is two orders of magnitude higher than the electron concentration of the $n^+a$-Si obtained by the doping method. From the aspect of the final resistance, the resistance of the $n^+a$-Si obtained by the PECVD method is less than 1000, and the electrical conducting property thereof is good, while the $n^+a$-Si obtained by the doping method has a greater resistance and a poorer electrical conducting property. Thus, the $n^+a$-Si obtained by the PECVD method more effectively eliminate the Vth shift phenomenon of the LTPS thin film transistor.

Step 3: a second buffer layer 4 is formed on the heavily doped amorphous silicon layer 8.

For example, the second buffer layer 4 may be deposited on the heavily doped amorphous silicon layer 8 by a PECVD method, and the second buffer layer 4 may be made of an oxide, a nitride, or an oxynitride.

Step 4: a polysilicon layer 5 is formed on the second buffer layer 4, and a light shielding pattern and an active layer of the LTPS thin film transistor are formed by a patterning process.

For example, a photoresist may be coated on the polysilicon layer 5 and exposed to form a photoresist-removed area and a photoresist-reserved area, then the heavily doped amorphous silicon layer 8, the second buffer layer 4 and the polysilicon layer 5 at the photoresist-removed area are removed, so as to form the light shielding pattern by the heavily doped amorphous silicon layer 8 at the photoresist-reserved area and form the active layer of the LTPS thin film transistor by the polysilicon layer 5 at the photoresist-reserved area; and then the photoresist at the photoresist-reserved area is peeled off.

Then, a gate insulating layer, a gate electrode, an interlayer insulating layer, a source electrode and a drain electrode of the LTPS thin film transistor may be prepared by a manufacturing process in the related art, so as to prepare an LTPS thin film transistor, which will not be reiterated here.

The embodiments of the present disclosure further provide an LTPS thin film transistor which is manufactured by the method as described above.

In this embodiment, the light shielding pattern of the LTPS thin film transistor is made of a semiconductor material, so that the light shielding pattern and the active layer of the LTPS thin film transistor can be simultaneously formed by one single patterning process rather than forming the light shielding pattern and the active layer separately by two patterning processes. Thus, the numbers of patterning processes for the LTPS thin film transistor and the LTPS array substrate are reduced, thereby being capable of lowering the production cost of the LTPS array substrate and effectively increasing the productivity of the LTPS array substrate.

Optionally, the light shielding pattern may be made of heavily doped amorphous silicon, so as to weaken the semiconductor properties of the light shielding pattern and weaken the adverse effect on the light shielding pattern caused by the voltage applied to the gate electrode of the LTPS thin film transistor. Therefore, the adverse effect of the light shielding pattern on the active layer of the LTPS thin film transistor may be weakened, and thus the problem of the Vth shift of the LTPS thin film transistor is reduced or eliminated, thereby ensuring the performance of the LTPS thin film transistor.

Figure 5:
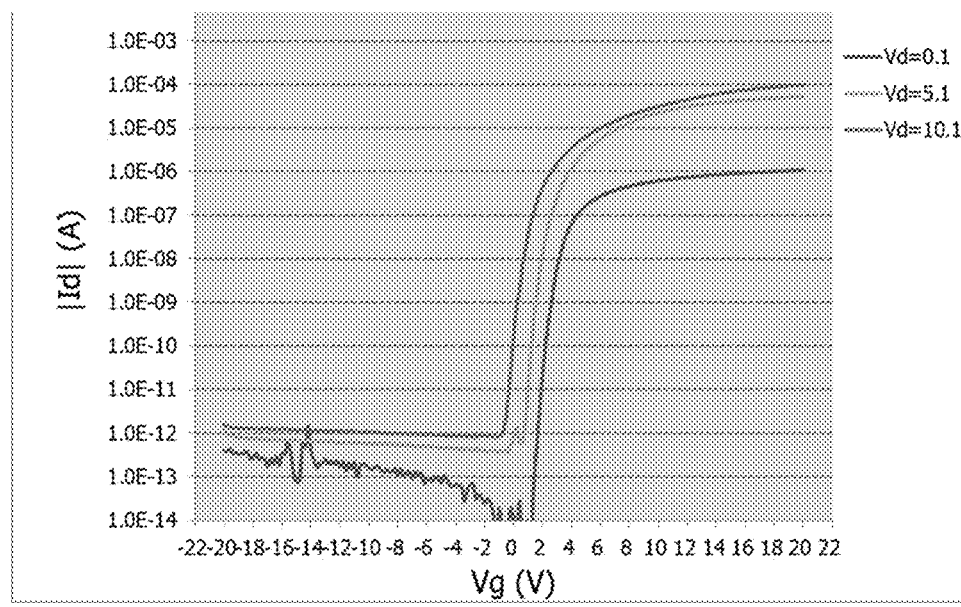
FIG. 5 shows the characteristic of the thin film transistor according to the present disclosure in which the shielding pattern is formed of amorphous silicon.
Figure 6:
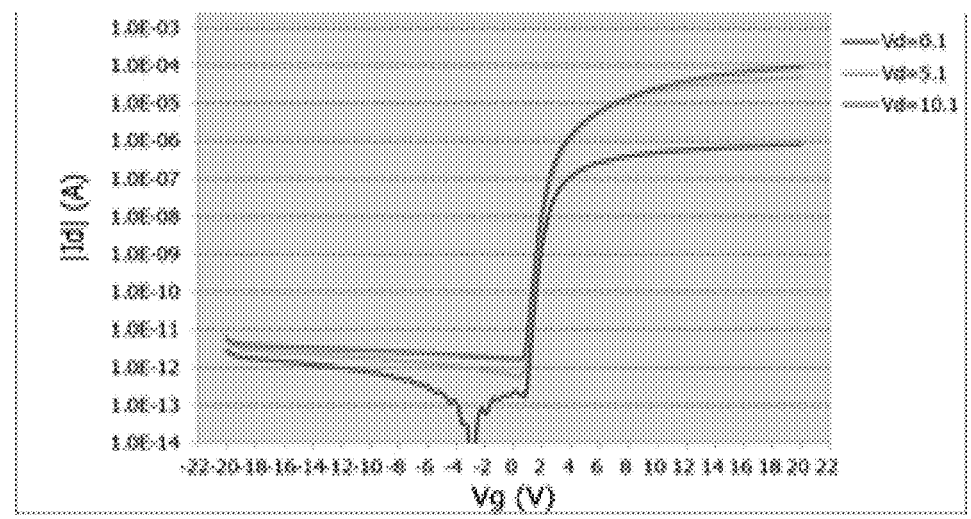
FIG. 6 shows the characteristic of the thin film transistor according to the present disclosure in which the shielding pattern is formed of heavily doped amorphous silicon.

FIG. 5 shows the characteristic of the thin film transistor in which the heavily doped amorphous silicon in example 1 is replaced with amorphous silicon. FIG. 6 shows the characteristic of the thin film transistor according to example 1 of the present disclosure in which the shielding pattern is formed of heavily doped amorphous silicon. In both figures, Vg in the horizontal axis represents a voltage applied on the gate electrode, |Id| in the vertical axis represents a source-drain current, and Vd represents a voltage between the source and the drain electrode. Three curves from bottom to top in each figure respectively correspond to three conditions of Vd=0.1, Vd=5.1 and Vd=10.1. It can be seen from FIG. 5 and FIG. 6 that the Vth shift in the characteristic of the thin film transistor using heavily doped amorphous silicon is greatly reduced as compared with that using amorphous silicon.

It may be verified from the above that after the material of the light shielding pattern of the LTPS thin film transistor is changed from a-Si to $n^+a$-Si, the Vth shift of the LTPS thin film transistor is greatly reduced.

Optionally, when the light shielding pattern is made of heavily doped amorphous silicon, a thickness of the light shielding pattern is about 500 Å to about 1500 Å. The wording "about" means that a value can vary within a range of ±1. When the light shielding pattern achieves this thickness, the light shielding pattern may not only have an effect of light shielding, but also avoids the thickness of the LTPS thin film transistor from being too large.

The embodiments of the present disclosure further provide a method for manufacturing an LTPS array substrate, which includes manufacturing an LTPS thin film transistor on a base substrate by the method as described above.

In this embodiment, the light shielding pattern of the LTPS thin film transistor is made of a semiconductor material, so that the light shielding pattern and the active layer of the LTPS thin film transistor can be simultaneously formed by one single patterning process rather than forming the light shielding pattern and the active layer separately by two patterning processes. Thus, the numbers of patterning processes for the LTPS thin film transistor and the LTPS array substrate are reduced, thereby being capable of lowering the production cost of the LTPS array substrate and effectively increasing the productivity of the LTPS array substrate.

Optionally, the light shielding pattern of the LTPS array substrate may be made of heavily doped amorphous silicon, so as to weaken the semiconductor properties of the light shielding pattern and weaken the adverse effect on the light shielding pattern caused by the voltage applied to the gate electrode of the LTPS thin film transistor. Therefore, the adverse effect of the light shielding pattern on the active layer of the LTPS thin film transistor may be weakened, and thus the problem of the Vth shift of the LTPS thin film transistor is reduced or eliminated, thereby ensuring the performance of the LTPS thin film transistor.

The embodiments of the present disclosure further provide an LTPS array substrate, which includes the LTPS thin film transistor as described above arranged on a base substrate.

In this embodiment, the light shielding pattern of the LTPS thin film transistor is made of a semiconductor material, so that the light shielding pattern and the active layer of the LTPS thin film transistor can be simultaneously formed by one single patterning process rather than forming the light shielding pattern and the active layer separately by two patterning processes. Thus, the numbers of patterning processes for the LTPS thin film transistor and the LTPS array substrate are reduced, thereby being capable of lowering the production cost of the LTPS array substrate and effectively increasing the productivity of the LTPS array substrate.

Optionally, the light shielding pattern of the LTPS array substrate may be made of heavily doped amorphous silicon, so as to weaken the semiconductor properties of the light shielding pattern and weaken the adverse effect on the light shielding pattern caused by the voltage applied to the gate electrode of the LTPS thin film transistor. Therefore, the adverse effect of the light shielding pattern on the active layer of the LTPS thin film transistor may be weakened, and thus the problem of the Vth shift of the LTPS thin film transistor is reduced or eliminated, thereby further ensuring the performance of the LTPS thin film transistor.

The embodiments of the present disclosure further provide a display device, which includes the LTPS array substrate as described above. The display device may be any product or component having a display function, such as a liquid crystal television, an LCD, a digital photo frame, a mobile phone, a tablet computer, etc., in which the display device further includes a flexible circuit board, a printed circuit board and a backplane.

In the method embodiments of the present disclosure, the serial numbers of the steps cannot be used to define the sequence of the steps. As for a person skilled in the art, the changes in the order of steps without paying creative work also fall within the scope of the present disclosure.

Unless otherwise defined, technical terms or scientific terms used herein have the normal meaning commonly understood by a person skilled in the art in the field of the present disclosure. The words "first", "second", and the like used in the present disclosure do not denote any order, quantity, or importance, but rather merely serve to distinguish different components. The words "including", "comprising", and the like used in the present disclosure means that the element or item appeared in front of the words encompasses the element or item and their equivalents listed after the words, and does exclude other elements or items. The words "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may be changed, accordingly.

It will be understood that when an element, such as a layer, film, area, or substrate, is referred to as being "on" or "under" another element, the element can be directly "on" or "under" another element, or there may be an intermediate element therebetween.

The above descriptions are exemplary embodiments of the present disclosure. It should be noted that a person skilled in the art would make improvements and modifications without departing from the principles of the present disclosure. These improvements and modifications should also be regarded as falling in the protection scope of the present disclosure.

What is claimed is:

1. A method for manufacturing a low temperature polysilicon (LTPS) thin film transistor, comprising:
    forming a light shielding pattern and an active layer of the LTPS thin film transistor on a base substrate through one single patterning process, wherein an orthogonal projection of the active layer on the base substrate falls within an orthogonal projection of the light shielding pattern on the base substrate, and the light shielding pattern is made of a semiconductor material,
    wherein an electrical conductivity of the semiconductor material adopted by the light shielding pattern is greater than that of amorphous silicon,
    wherein the light shielding pattern is made of heavily doped amorphous silicon, and
    wherein a thickness of the light shielding pattern is about 500 Å to about 1500 Å.

2. The method according to claim 1, wherein the forming the light shielding pattern and the active layer of the LTPS thin film transistor on the base substrate through the one single patterning process comprises:
    forming a first buffer layer on the base substrate;
    forming a heavily doped amorphous silicon layer on the first buffer layer;
    forming a second buffer layer on the heavily doped amorphous silicon layer;
    forming a polysilicon layer on the second buffer layer;
    coating a photoresist on the polysilicon layer and exposing the photoresist to form a photoresist-removed area and a photoresist-reserved area, and removing the heavily doped amorphous silicon layer, the second buffer layer and the polysilicon layer at the photoresist-removed area, to form the light shielding pattern by the heavily doped amorphous silicon layer at the photoresist-reserved area and form the active layer by the polysilicon layer at the photoresist-reserved area; and peeling off the photoresist at the photoresist-reserved area.

3. The method according to claim 2, wherein the forming the heavily doped amorphous silicon layer on the first buffer layer comprises:

forming the heavily doped amorphous silicon layer on the first buffer layer by plasma enhanced chemical vapor deposition (PECVD).

4. A method for manufacturing an LTPS array substrate, comprising manufacturing an LTPS thin film transistor on a base substrate by the method according to claim 1.

5. The method according to claim 4, wherein the forming the light shielding pattern and the active layer of the LTPS thin film transistor on the base substrate through the one single patterning process comprises:

forming a first buffer layer on the base substrate;

forming a heavily doped amorphous silicon layer on the first buffer layer;

forming a second buffer layer on the heavily doped amorphous silicon layer;

forming a polysilicon layer on the second buffer layer;

coating a photoresist on the polysilicon layer and exposing the photoresist to form a photoresist-removed area and a photoresist-reserved area, and removing the heavily doped amorphous silicon layer, the second buffer layer and the polysilicon layer at the photoresist-removed area, to form the light shielding pattern by the heavily doped amorphous silicon layer at the photoresist-reserved area and form the active layer by the polysilicon layer at the photoresist-reserved area; and peeling off the photoresist at the photoresist-reserved area.

6. The method according to claim 5, wherein the forming the heavily doped amorphous silicon layer on the first buffer layer comprises:

forming the heavily doped amorphous silicon layer on the first buffer layer by PECVD.

* * * * *